(12) United States Patent
Chiu et al.

(10) Patent No.: US 9,177,831 B2
(45) Date of Patent: Nov. 3, 2015

(54) DIE ASSEMBLY ON THIN DIELECTRIC SHEET

(71) Applicants: Chia-Pin Chiu, Tempe, AZ (US); Qing Ma, Saratoga, CA (US); Robert L. Sankman, Phoenix, AZ (US); Paul B. Fischer, Portland, OR (US); Patrick Morrow, Portland, OR (US); William J. Lambert, Chandler, AZ (US); Charles A. Gealer, Phoenix, AZ (US); Tyler Osborn, Gilbert, AZ (US)

(72) Inventors: Chia-Pin Chiu, Tempe, AZ (US); Qing Ma, Saratoga, CA (US); Robert L. Sankman, Phoenix, AZ (US); Paul B. Fischer, Portland, OR (US); Patrick Morrow, Portland, OR (US); William J. Lambert, Chandler, AZ (US); Charles A. Gealer, Phoenix, AZ (US); Tyler Osborn, Gilbert, AZ (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 14/041,722

(22) Filed: Sep. 30, 2013

(65) Prior Publication Data

US 2015/0091182 A1     Apr. 2, 2015

(51) Int. Cl.
*H01L 21/00*     (2006.01)
*H01L 21/48*     (2006.01)
*H01L 23/538*    (2006.01)
*H01L 23/00*     (2006.01)
*H01L 23/15*     (2006.01)
*H01L 21/56*     (2006.01)
*H01L 23/31*     (2006.01)

(52) U.S. Cl.
CPC ........ *H01L 21/4803* (2013.01); *H01L 23/5384* (2013.01); *H01L 23/5389* (2013.01); *H01L 24/19* (2013.01); *H01L 24/97* (2013.01); *H01L 21/561* (2013.01); *H01L 21/568* (2013.01); *H01L 23/15* (2013.01); *H01L 23/3121* (2013.01); *H01L 2224/04105* (2013.01); *H01L 2224/12105* (2013.01); *H01L 2224/16225* (2013.01); *H01L 2224/2499* (2013.01); *H01L 2224/24137* (2013.01); *H01L 2224/32225* (2013.01); *H01L 2224/73204* (2013.01)

(58) Field of Classification Search
USPC ............ 257/106, 15, 25, 26, 51, 55, 64, 118, 257/126; 438/106, 15, 25, 26, 51, 55, 64, 438/118, 126
See application file for complete search history.

(56) References Cited

U.S. PATENT DOCUMENTS

| | | | |
|---|---|---|---|
| 7,541,265 B2 * | 6/2009 | Das et al. | 438/528 |
| 2010/0140771 A1 * | 6/2010 | Huang et al. | 257/686 |
| 2011/0108986 A1 * | 5/2011 | Lin et al. | 257/751 |
| 2012/0037411 A1 * | 2/2012 | Hsu et al. | 174/260 |

* cited by examiner

*Primary Examiner* — Timor Karimy
(74) *Attorney, Agent, or Firm* — Blakely, Sokoloff, Taylor & Zafman LLP

(57) ABSTRACT

A die assembly formed on a thin dielectric sheet is described. In one example, a first and a second die have interconnect areas. A dielectric sheet, such as glass, silicon, or oxidized metal is applied over the interconnect areas of dies. Conductive vias are formed in the dielectric sheet to connect with pads of the interconnect areas. A build-up layer includes routing to connect pads of the first die interconnect area to pads of the second die interconnect area through the conductive vias and a cover is applied over the dies, the dielectric sheet, and the build-up layer.

15 Claims, 5 Drawing Sheets

DIE ASSEMBLY ON THIN DIELECTRIC SHEET

CROSS-REFERENCE TO RELATED APPLICATION

This patent application is a U.S. National Phase Application under 35 U.S.C. §371 of International Application No. PCT/US2013/048323, filed Jul. 27, 2013, entitled "HIGH CONDUCTIVITY HIGH FREQUENCY VIA FOR ELECTRONIC SYSTEMS", the priority of which is hereby claimed.

FIELD

The present description relates to the field of forming connections between chips within a package and, in particular, to forming connections using a thin dielectric sheet.

BACKGROUND

Microelectronic and micromechanical dies are often packaged to protect the die from an external environment and to provide connections to a PCB (printed circuit board), to a socket, to another package, or to some other interface. PCBs and sockets are typically made of a less expensive material that is not able to provide connections that are as close together as those of the die. A silicon or gallium arsenide die may have connection pads that are no more than 1 or 2 μm apart, while a PCB may have a structure that is able to provide connections that are no closer than 100 μm apart. The package typically has a substrate that connects the much closer connections of the die on one side and spreads them apart to form connections that are much farther apart on the other side.

Product architectures now contain several very different functions, such as CPU logic, graphics functions, cache memory, radio signaling, and other system functions to create integrated SOC (System on Chip) designs. The SOC tries to provide as many of these different functions as possible on a single chip. This lowers the product's design complexity and component count, simplifying manufacture, and reducing cost. However, depending on how many functions are combined, the single chip may be difficult to manufacture or limited in its performance.

Multichip packages allow each die to be built using the best or lowest cost manufacturing process and materials. The dies may then be combined into a single package, easing the assembly and design of the final product. Since the dies are often much smaller than the package, a multichip package may not be very much larger than a package for a single SOC. To further improve performance, a multichip package will have chip to chip interconnections inside the package. Wire leads and special substrates inside the package are used to accomplish these connections. For silicon dies, the special substrates are typically silicon substrates because silicon has the same CTE (Coefficient of Thermal Expansion) as the dies and because it can provide connection points which are as close together as those on the silicon die.

Because the temperatures inside the package can change from very cold when the end device is turned off and in a cold place to very hot when the package is powered up and running at maximum speed, the dies will expand and contract with temperature. If the connections are not flexible like wires or if the substrate expands and contracts at a different rate, then the connections may be broken.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

A thin sheet of glass may be used to integrate multiple dies into a silicon die assembly. The glass can provide dense interconnect features between the dies. A glass sheet does not require the mixed bump pitch FLI (First Level Interconnect) required for EmIB (Embedded Interconnect Bridge). The package assembly process may also be simplified by attaching the dies first through the glass and then attaching the die assembly to a package substrate that has a coarser bump pitch.

A passive silicon interposer may be used to connect dies within a package. While the silicon is able to provide a high density chip to chip interconnection, this comes at a significant additional cost. The silicon interposer is expensive and additional materials and assembly process steps are required.

The thin piece of glass provides dense interconnect features between the dies which allows for high bandwidth interconnects. Etching and copper plating can be used to connect the thin glass to the Si dies, eliminating the mixed bump pitch FLI assembly process required by both silicon interposers and EmIB. The package assembly process can be simplified by first assembling the dies to each other and then attaching the assembled dies with the glass sheet to a package substrate that has a coarser bump pitch.

Figure 1:
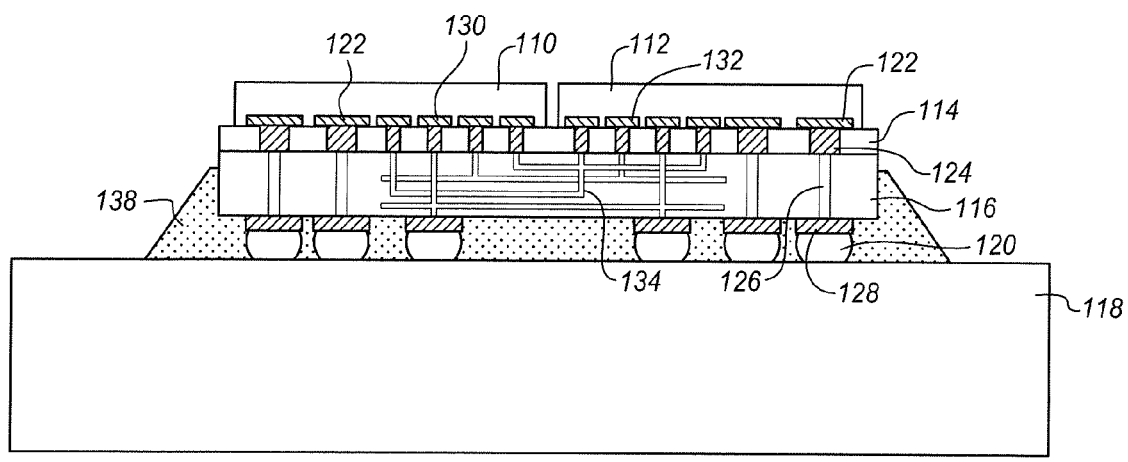
FIG. 1 is a cross-sectional side view of a package formed using a thin substrate according to an embodiment of the invention.

FIG. 1 is a cross-sectional diagram of a multiple chip package using a thin glass piece to integrate the dies together with interconnection layers and connections to the package substrate. The dies 110, 112 have interconnection areas 130, 132 for connection to each other and separate connection areas 122 for connection through a build-up layer 116 to a package substrate 118. The dies are mounted to a thin glass sheet 114 that has vias 124 to connect each die to a build-up layer 116. The vias 124 in the glass sheet 114 are copper filled, although other types of vias may be used.

For connection to the package substrate 118, the vias 124 in the glass sheet connect to a pad on each die 122 through the via in the glass sheet and from there through a via 126 in the build-up layer 116 to reach a copper pad 128 in the build-up layer. The build-up layer is coupled to the package substrate using, for example, solder ball connections 120. Connections between the dies can be made from one interconnection area 130 to the other 132 using an array of copper vias 124 through the glass sheet into routing or redistribution layers 134 within the build-up layer 116. The dies and build-up layer are protected by a package cover 138 attached to the package substrate which in this case is a molding compound. An under fill may also or alternatively be provided between the build-up layer and the package substrate depending on the particular implementation.

Figure 2A:
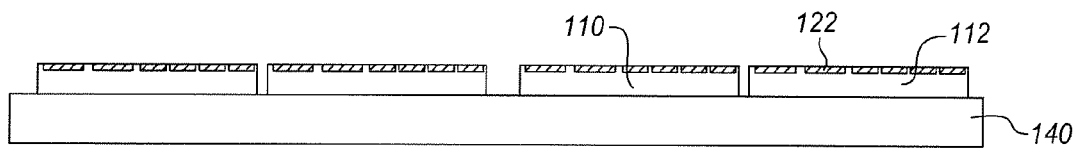
FIGS. 2A to 2H are cross-sectional side views of a sequence of stages in forming the package of FIG. 1 according to an embodiment of the invention.

FIGS. 2A to 2H are simplified cross-sectional diagrams stages in the production of package such as that of FIG. 1. FIG. 2A shows an early stage in which a group of silicon dies are formed on a wafer. The dies 110, 112 may have via pads 122 over a silicon dioxide layer which then are polished flush to form a flush surface with copper pads. The connection surface may also be coated with a nitride after being polished flat. This may then be followed by an oxide coating depending on the particular type of die and its intended application.

The wafer is cut into individual dies and the dies 110, 112 are placed on a glass carrier 140 the dies may be placed on a large glass sheet so that many dies can be processed at the same time. A placing or pick and place machine may be used to select the appropriate dies and arrange them in an appropriate configuration. The dies may be fastened to the glass carrier 140 in a variety of different ways. In one example a spin coated UV curable adhesive is used. The glass carrier may be made of a variety of different types of glass. The glass of the carrier may be selected to have a CTE (Coefficient of Thermal Expansion) similar to that of the die substrates, typically of silicon. The carrier may have any of a variety of different thicknesses, depending on the particular implementation, for example form 500 µm to 1100 µm.

Figure 2B:
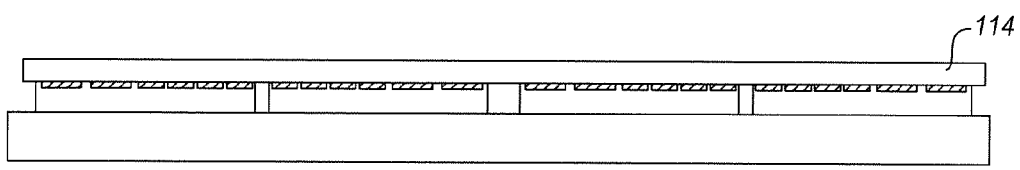

FIG. 2B shows the two different types of dies 110, 112 attached to the glass carrier 140. The dies have a connection surface which is opposite the glass carrier and may be pretreated. A single thin glass piece 114 is applied above each of the dies. The glass may be a simple extruded sheet approximately 30 µm thick.

Common glass materials are moderately flexible, easy to cut, and have a co-efficient of thermal expansion which is similar to that of Si and the dies. Because the glass is flexible, the glass can bend to accommodate small differences in height between the dies. A typical glass sheet is also a dielectric and acts like a diffusion barrier between the dies, the metals, and any other materials on opposite sides of the glass sheet. The glass sheet may by fastened using a low temperature level direct oxide bonding. For the thin sheet and the glass carrier a variety of different glass materials may be used. In one example, SCHOTT AF32® eco Thin Glass is used with a CTE of 3.2 ppm/K which matches silicon. This glass has a polished surface is stable to 600° C. and is has a high dielectric constant. It can easily be cut by any saw that can cut a silicon die or wafer.

Alternatively, materials other than glass may be used for both the glass sheet and the carrier. As mentioned above, stability, flexibility, a high dielectric constant, and a CTE similar to Si are all desirable attributes. As an example, a thin Al sheet may be used with an oxidized surface instead of glass. A thin sheet of anodically etched Al may be used with Cu filled pores. A thin layer of Si that is oxide bonded, thinned, or layer transferred, may be used. Other materials may also be used, depending on the particular implementation. The same techniques and configurations as described here may be applied as desired.

Figure 2C:
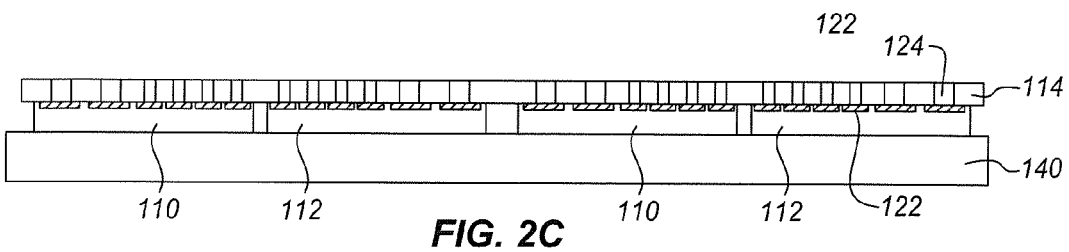

In FIG. 2C via holes 124 are etched through the glass sheet 114. These via holes may be etched all the way through the glass to the copper inner connection pads 122 on each die.

Figure 2D:
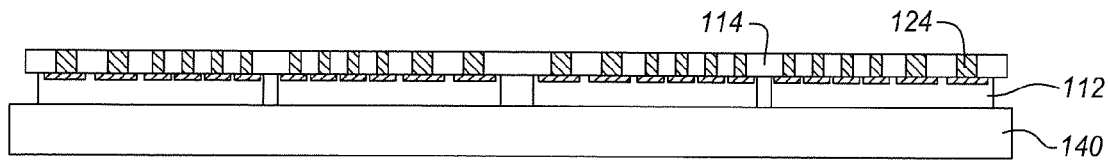

FIG. 2D shows the via holes 124 filled with copper to provide a conducting electrical connection between each die and subsequent layers formed over the glass sheet to connect with the dies.

Figure 2E:
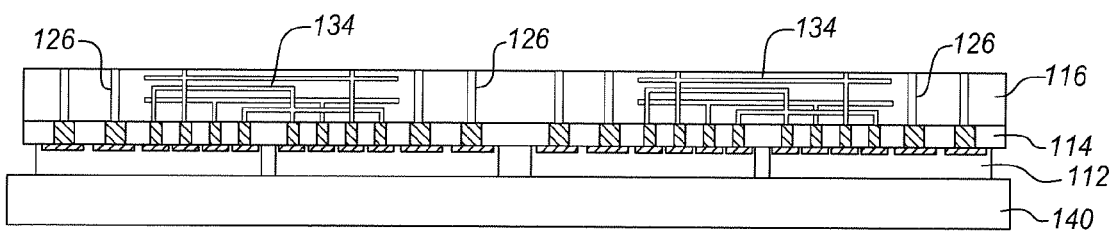

In FIG. 2E build-up layers 116 are formed over the glass sheet 114. The build-up layers may include direct connections 126 to external components as well as interconnect layers 134 to connect an interconnection area on one die to an interconnection area on another die. In some cases the connections to the package substrate through vias 126 include connections for external power and ground, whereas the connections between dies are for data and control signals between the dies, however the invention is not so limited. The glass sheet 114 provides a consistent, smooth substrate for the build-up layers. The glass carrier 140 holds all the parts securely in position.

Figure 2F:
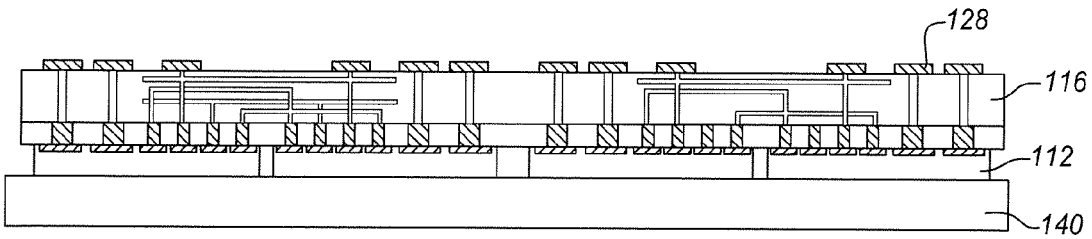

In FIG. 2F copper pads 128 are applied to each of the connectors in the build-up layers 116. As shown in the diagram of FIG. 2F there are copper pads for both the interconnection areas of the dies for data and control as well as for power areas to drive the dies.

Figure 2G:
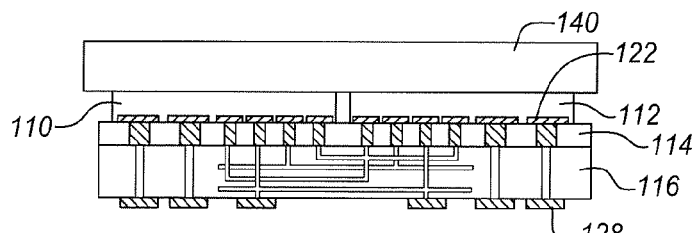

In FIG. 2G the glass wafer and build-up areas have been diced to form a glass carrier 140 with only two dies 110, 112 and the corresponding part of the build-up layers. The particular number of dies and the type of the dies may be adapted to suit any particular implementation.

Figure 2H:
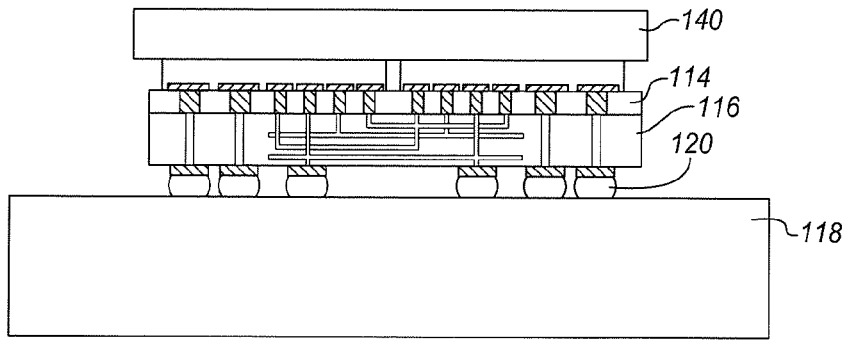

In FIG. 2H the glass carrier and the two dies are flipped and soldered to a package substrate 118. After this, the glass carrier 140 may be removed using a laser or an adhesive dissolving chemical solution. A molding compound 138 is then applied to arrive at the package shown in FIG. 1.

Figure 3A:
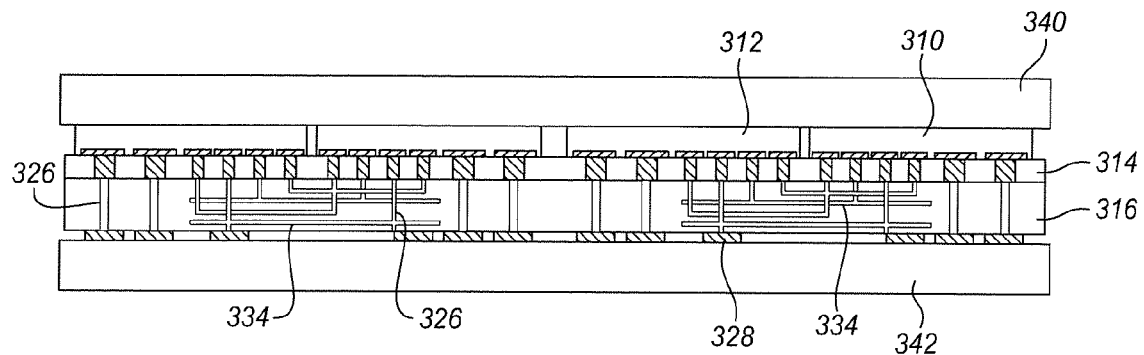
FIGS. 3A to 3D are cross-sectional side views of an alternative sequence of stages in forming a package after the stage of FIG. 2F according to an embodiment of the invention.
Figure 3B:
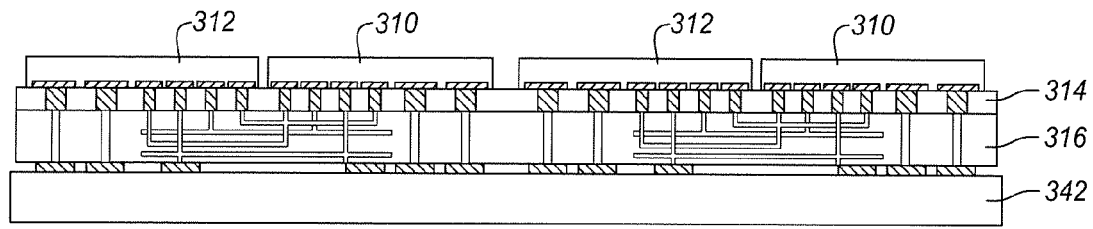
Figure 3C:
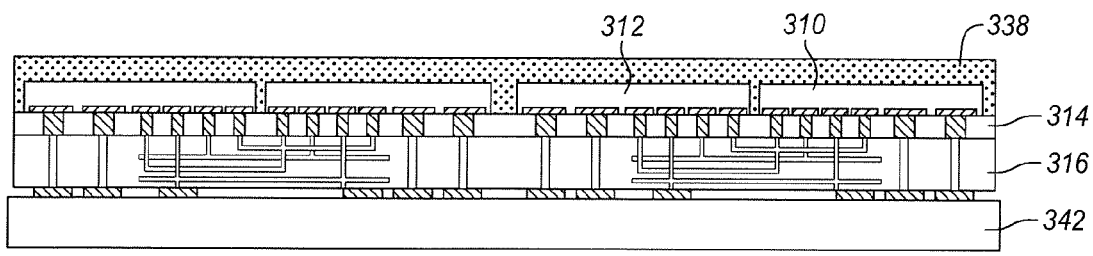
Figure 3D:
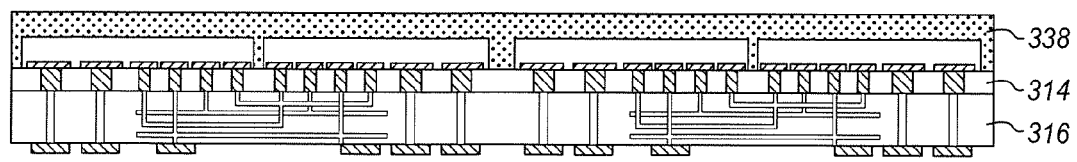
Figure 3E:
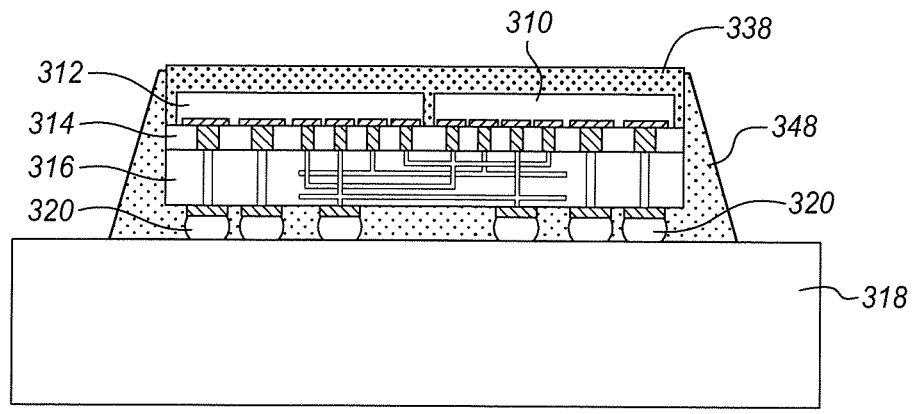
FIG. 3E is a cross-sectional side view of the package formed by the stages of FIGS. 3A to 3D according to an embodiment of the invention.

FIGS. 3A to 3D are cross-sectional diagrams of some of the stages in an alternative process for fabricating an alternative package as shown in the cross-sectional diagram of FIG. 3E. After the build-up layers 116 and connection pads 128 are formed over the thin glass piece 114 on the wafer level on a glass carrier 140 as shown in FIG. 2F, a second carrier may be bonded to the build-up layer as shown in FIG. 3A. As shown a pair of dies 310, 312 have been placed on a glass carrier 340. A thin glass sheet 314 has been bonded to the tops of the dies. A build-up layer 316 has been formed over the dies with vias to interconnect the dies and to connect the dies to other external components. Copper connection pads 328 have been applied to the vias on the build-up layers. Finally, the second carrier 342 is bonded to the top of the build-up layer 316 over the connection pads 328.

In FIG. 3B having applied the second glass carrier 342 the first glass carrier 340 can be removed using for example a laser to debond the glass carrier. This exposes the front side of the dies 310, 312. The second glass carrier 342 now provides structural support and rigidity for the build-up layers 316 and the positioning of the dies.

In FIG. 3C a cover such as a molding compound 338 is applied over all of the dies holding the dies in place and protecting them from the external environment.

In FIG. 3D, with the molding compound 338 in place, the second glass carrier 342 is debonded from the build-up layers 316 and attachment pads 328. The dies may then be singulated by dicing through the molding compound 338, the thin glass sheet 314 between the dies, and the build-up layers 316.

As shown in FIG. 3E the resulting pairs of dies coupled together through the build-up layer can then be attached to a package substrate 318 using for example solder balls 320. The resulting package can then be protected using a molding compound or under fill 348. The resulting package of FIG. 3E is similar to that of FIG. 1 with changes in how the parts are combined connected and assembled. The package of FIG. 1 may be modified by applying additional molding compound to completely cover the dies or to only partially cover the dies depending on the particular implementation.

Figure 4:
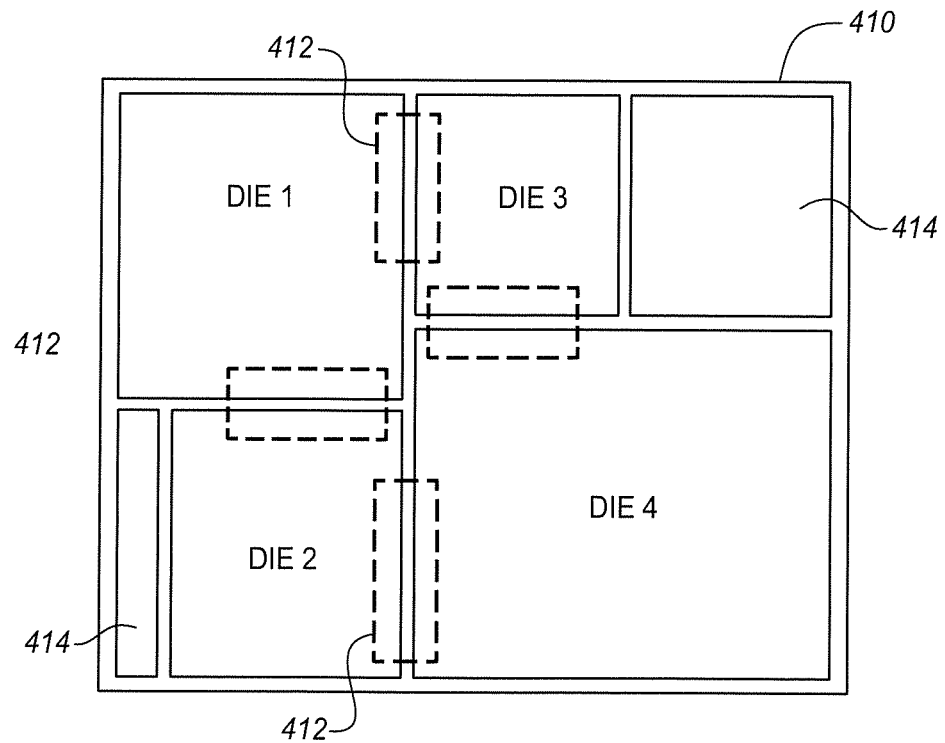
FIG. 4 is a top elevation view of a package formed according to an embodiment of the invention.

FIG. 4 is an example of a multiple die package that may be formed using the approach of FIGS. 2A through 2H or FIGS. 2A through 2F and 3A through 3E. In this example there are four dies all attached to a single thin glass sheet 410 the dies are labeled die 1, die 2, die 3 and die 4. Each of these dies may be placed on a glass carrier as shown in FIG. 2A and then covered with a single thin glass sheet 410 as shown for example in FIG. 2B. The dies each have dense interconnect areas 412 through which the dies are able to communicate with adjacent dies. These interconnect layers may be formed through the thin glass sheet 410 that is laid over each of the dies as shown for example in FIG. 2D. A transposer, build-up layer, or any other kind of routing layer, depending on the particular implementation, may then be formed over the glass to provide connections between all of the interconnects.

In the example of FIG. 4 there are exposed areas 414 of glass that remain after the four dies are placed on the glass carrier. These exposed areas 414 may optionally be filled with a dummy Si or glass to protect the otherwise exposed thin glass 410. FIG. 4 shows that while only two dies are shown in the assembly process examples of FIGS. 2A to 2H and 3A to 3E, additional dies may be combined into a single package. The dies may extend in multiple directions across a glass sheet to form any desired package configuration.

Figure 5:
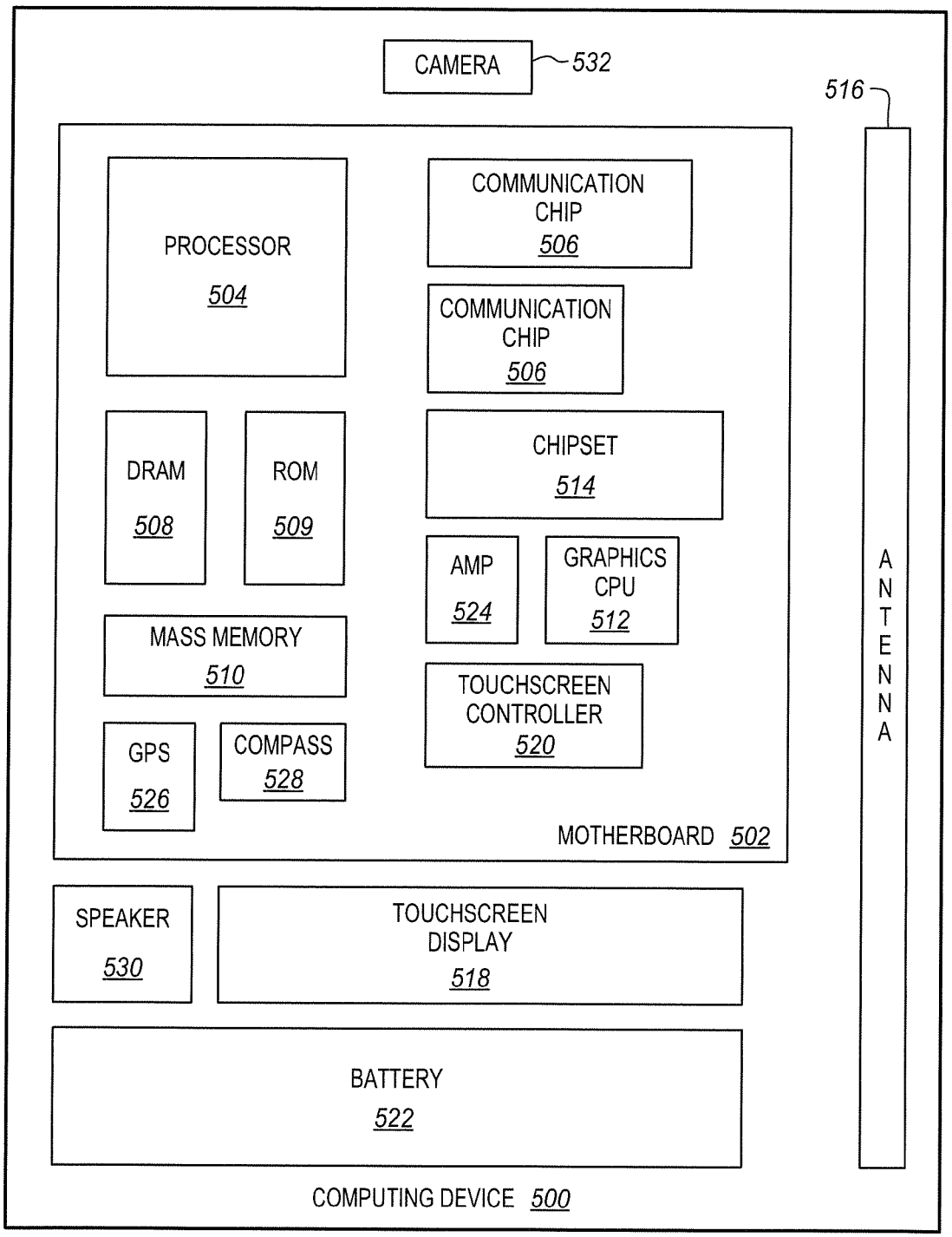
FIG. 5 is a block diagram of a computing device incorporating a multiple die package according to an embodiment.

FIG. 5 illustrates a computing device 500 in accordance with one implementation of the invention. The computing device 500 houses a board 502. The board 502 may include a number of components, including but not limited to a processor 504 and at least one communication chip 506. The processor 504 is physically and electrically coupled to the board 502. In some implementations, the at least one communication chip 506 is also physically and electrically coupled to the board 502. In further implementations, the communication chip 506 is part of the processor 504.

Depending on its applications, computing device 500 may include other components that may or may not be physically and electrically coupled to the board 502. These other components include, but are not limited to, volatile memory (e.g., DRAM) 508, non-volatile memory (e.g., ROM) 509, flash memory (not shown), a graphics processor 512, a digital signal processor (not shown), a crypto processor (not shown), a chipset 514, an antenna 516, a display 518 such as a touchscreen display, a touchscreen controller 520, a battery 522, an audio codec (not shown), a video codec (not shown), a power amplifier 524, a global positioning system (GPS) device 526, a compass 528, an accelerometer (not shown), a gyroscope (not shown), a speaker 530, a camera 532, and a mass storage device (such as a hard disk drive) 510, compact disk (CD) (not shown), digital versatile disk (DVD) (not shown), and so forth). These components may be connected to the system board 502, mounted to the system board, or combined with any of the other components.

The communication chip 506 enables wireless and/or wired communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. In some implementations of the invention, the integrated circuit die of the processor, memory devices, communication devices, or other components include one or more dies that are packaged together using a glass sheet, if desired. The term "processor" may refer to any device or portion of a device that processes electronic data from registers and/or memory to transform that electronic data into other electronic data that may be stored in registers and/or memory.

In various implementations, the computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Embodiments may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

References to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

In the following description and claims, the terms "chip" and "die" are used interchangeably to refer to any type of microelectronic, micromechanical, analog, or hybrid small device that is suitable for packaging and use in a computing device.

As used in the claims, unless otherwise specified, the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein. Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

The following examples pertain to further embodiments. The various features of the different embodiments may be variously combined with some features included and others excluded to suit a variety of different applications. Some embodiments pertain to a method including attaching a first and a second die to a carrier, the first and the second die each having interconnect areas on a side opposite the carrier, attaching a dielectric sheet over the interconnect areas of the first and the second die, forming conductive vias in the dielectric sheet to connect with pads of the interconnect areas, depositing build-up layers over the dielectric sheet, the build-up layers including routing to connect pads of the first die interconnect area to pads of the second die interconnect area through the conductive vias, and packaging the dies, the dielectric sheet, and the build-up layers.

In some embodiments attaching the dies comprises attaching the dies to a glass carrier with an adhesive. Attaching the dielectric sheet comprises attaching the dielectric sheet with direct oxide bonding. Forming conductive vias comprises etching via holes through the dielectric sheet to the pads. Forming conductive vias comprises filling the etched via holes with copper.

Some embodiments include depositing pads on the build-up layers for connection to a package substrate. Some embodiments include removing the carrier before packaging. Some embodiments include covering the dies with a molding compound.

In some embodiments, packaging comprises attaching the dies to package substrate through the build-up layers, then removing the carrier, then covering the dies. The carrier is formed of a glass. Packaging includes applying a second dielectric carrier to the build-up layers opposite the first carrier, removing the first carrier, applying a molding compound over the dies, removing the second dielectric carrier, and attaching the dies to a package substrate through the build-up layers.

Some embodiments include applying underfill between the build-up layers and the package substrate.

Some embodiments pertain to an apparatus including a first and a second die, each having interconnect areas, a dielectric sheet over the interconnect areas of the first and the second die, conductive vias in the dielectric sheet to connect with pads of the interconnect areas, a build-up layer including routing to connect pads of the first die interconnect area to pads of the second die interconnect area through the conductive vias, and a package cover over the dies, the dielectric sheet, and the build-up layer.

In some embodiments the conductive vias are copper filled. The package cover is a molding compound.

Some embodiments include a package substrate coupled to the build-up layer and to the package cover. Some embodiments include underfill between the build-up layer and the package substrate.

Some embodiments pertain to a computer system with a display, a user interface, and a processor package. The package has a first and a second die, each having interconnect areas, a dielectric sheet over the interconnect areas of the first and the second die, conductive vias in the dielectric sheet to connect with pads of the interconnect areas, a build-up layer including routing to connect pads of the first die interconnect area to pads of the second die interconnect area through the conductive vias, and a package cover over the dies, the dielectric sheet, and the build-up layer.

In some embodiments, the dielectric sheet is made from glass. The conductive vias are laser drilled holes filled with copper.

What is claimed is:

1. A method comprising:
   attaching a first and a second die to a carrier, the first and the second die each having interconnect areas on a side opposite the carrier;
   attaching a dielectric sheet over the interconnect areas of the first and the second die, the dielectric sheet having a polished surface facing the dies, and being stable to 600° C.;
   forming conductive vias in the dielectric sheet over the interconnect areas after attaching the dielectric sheet to connect with pads of the interconnect areas;
   depositing build-up layers over the dielectric sheet, the build-up layers including routing to connect pads of the first die interconnect area to pads of the second die interconnect area through the conductive vias; and
   packaging the dies, the dielectric sheet, and the build-up layers by mounting the dies to a package substrate through the build-up layers.

2. The method of claim 1, wherein attaching the dielectric sheet comprises attaching a glass sheet with an adhesive.

3. The method of claim 1, wherein attaching the dielectric sheet comprises attaching the dielectric sheet with direct oxide bonding.

4. The method of claim 1, wherein forming conductive vias comprises etching via holes through the dielectric sheet to the pads.

5. The method of claim 4, wherein forming conductive vias comprises filling the etched via holes with copper.

6. The method of claim 1, further comprising depositing pads on the build-up layers for connection to a package substrate.

7. The method of claim 1, further comprising removing the carrier before packaging.

8. The method of claim 1, further comprising covering the dies with a molding compound.

9. The method of claim 1, wherein packaging comprises removing the carrier, and then covering the dies.

10. The method of claim 9, wherein the carrier is formed of a glass.

11. The method of claim 10, further comprising applying underfill between the build-up layers and the package substrate.

12. The method of claim 1, wherein packaging comprises:
    applying a second dielectric carrier to the build-up layers opposite the first carrier;
    removing the first carrier;
    applying a molding compound over the dies;
    removing the second dielectric carrier; and
    attaching the dies to a package substrate through the build-up layers.

13. A integrated circuit die package fabricated according to claim 1.

14. A computer system comprising:
    a display;
    a user interface; and
    a processor package fabricated according to claim 1.

15. The method of claim 1, wherein attaching a dielectric sheet comprises attaching a dielectric sheet over many dies and then dicing through the dielectric sheet so that the first and second die are on one piece of the dielectric sheet after depositing build-up layers.

\* \* \* \* \*